US 9,884,742 B2

(12) United States Patent
Kattainen et al.

(10) Patent No.: US 9,884,742 B2
(45) Date of Patent: Feb. 6, 2018

(54) ELEVATOR SAFETY ARRANGEMENT HAVING EARTH FAULT DETECTION

(71) Applicant: KONE Corporation, Helsinki (FI)

(72) Inventors: Ari Kattainen, Hyvinkää (FI); Juha-Matti Aitamurto, Hyvinkää (FI); Lauri Stolt, Helsinki (FI)

(73) Assignee: KONE CORPORATION, Helsinki (FI)

( * ) Notice: Subject to any disclaimer, the term of this patent is extended or adjusted under 35 U.S.C. 154(b) by 425 days.

(21) Appl. No.: 14/678,111

(22) Filed: Apr. 3, 2015

(65) Prior Publication Data

US 2015/0210506 A1 Jul. 30, 2015

Related U.S. Application Data

(63) Continuation of application No. PCT/FI2013/051037, filed on Nov. 1, 2013.

(30) Foreign Application Priority Data

Nov. 5, 2012 (FI) ..................................... 20126150

(51) Int. Cl.
*B66B 1/34* (2006.01)
*B66B 3/00* (2006.01)
(Continued)

(52) U.S. Cl.
CPC ................ *B66B 3/002* (2013.01); *B66B 5/02* (2013.01); *H02H 3/16* (2013.01); *H02H 3/165* (2013.01); *H02H 7/1216* (2013.01); *H02P 27/06* (2013.01)

(58) Field of Classification Search
CPC ........... B66B 3/002; B66B 5/02; H02P 27/06; H02H 3/16; H02H 3/165; H02H 7/1216
(Continued)

(56) References Cited

U.S. PATENT DOCUMENTS 3,973,648 A * 8/1976 Hummert .............. B66B 5/0006
187/393
5,400,204 A * 3/1995 Oshima ................. B66B 5/0031
187/277
(Continued)

FOREIGN PATENT DOCUMENTS

FI         121493 B     11/2010
JP      2-142320 A     5/1990
(Continued)

OTHER PUBLICATIONS

"Low voltage electrical installations and safety at electrical work," SFS-KÄSIKIRJA 144, May 2002, pp. 37, 77-80 (6 pages total).

*Primary Examiner* — Anthony Salata
(74) *Attorney, Agent, or Firm* — Birch, Stewart, Kolasch & Birch, LLP

(57) ABSTRACT

A safety arrangement of an elevator and a method for monitoring electrical safety in an elevator system is disclosed. The safety arrangement of an elevator includes a motor drive having a main circuit, an accessible conducting part, which is earthed, an insulator, which is adapted to electrically insulate the aforementioned conducting part from the aforementioned main circuit and also a monitoring circuit, which determines an earth fault of the aforementioned main circuit occurring via the conducting part. The monitoring circuit forms a signal indicating the danger of electric shock in the motor drive of the elevator, if the earth fault is diagnosed.

20 Claims, 1 Drawing Sheet

(51) Int. Cl.
  *B66B 5/02* (2006.01)
  *H02H 3/16* (2006.01)
  *H02H 7/12* (2006.01)
  *H02P 27/06* (2006.01)

(58) Field of Classification Search
  USPC ....... 187/247, 290, 293, 296, 297, 391, 393;
    361/42, 44; 318/565, 434, 453, 474, 476;
    363/37, 40, 50, 52, 55; 340/540, 635,
    340/636.12, 647, 648, 652, 664
  See application file for complete search history.

(56) References Cited

U.S. PATENT DOCUMENTS

| | | | | |
|---|---|---|---|---|
| 6,055,163 | A * | 4/2000 | Wagner | H02J 3/38 323/241 |
| 6,262,550 | B1 * | 7/2001 | Kliman | G05B 23/0264 318/565 |
| 6,484,850 | B1 * | 11/2002 | Kobayashi | B66B 13/303 187/414 |
| 6,927,955 | B2 * | 8/2005 | Suzui | H02H 7/1222 361/42 |
| 7,256,701 | B2 * | 8/2007 | Kono | B60L 3/0023 324/551 |
| 7,699,142 | B1 * | 4/2010 | Wurth | B66B 5/0025 187/247 |
| 7,751,161 | B2 * | 7/2010 | Williams | H01H 83/02 361/42 |
| 7,772,806 | B2 * | 8/2010 | Kitanaka | B60L 11/1868 320/114 |
| 7,823,706 | B2 * | 11/2010 | Tyni | B66B 5/0031 187/391 |
| 7,894,169 | B2 * | 2/2011 | Valdez | H02H 3/17 361/42 |
| 7,920,393 | B2 * | 4/2011 | Bendre | H02M 7/487 363/127 |
| 8,049,455 | B2 * | 11/2011 | Kitanaka | B60L 3/003 318/563 |
| 9,046,560 | B2 * | 6/2015 | Li | G01R 31/025 |
| 9,160,161 | B2 * | 10/2015 | Li | H02P 29/027 |
| 9,162,850 | B2 * | 10/2015 | Hopp | B66B 11/001 |
| 2005/0151658 | A1 | 7/2005 | Kono et al. | |
| 2010/0219022 | A1 | 9/2010 | Syrman et al. | |

FOREIGN PATENT DOCUMENTS

| | | |
|---|---|---|
| JP | 5-328739 A | 12/1993 |
| JP | 2005-300412 A | 10/2005 |
| JP | 2009-115754 A | 5/2009 |
| JP | 2011-63431 A | 3/2011 |
| JP | 2011-141196 A | 7/2011 |

* cited by examiner

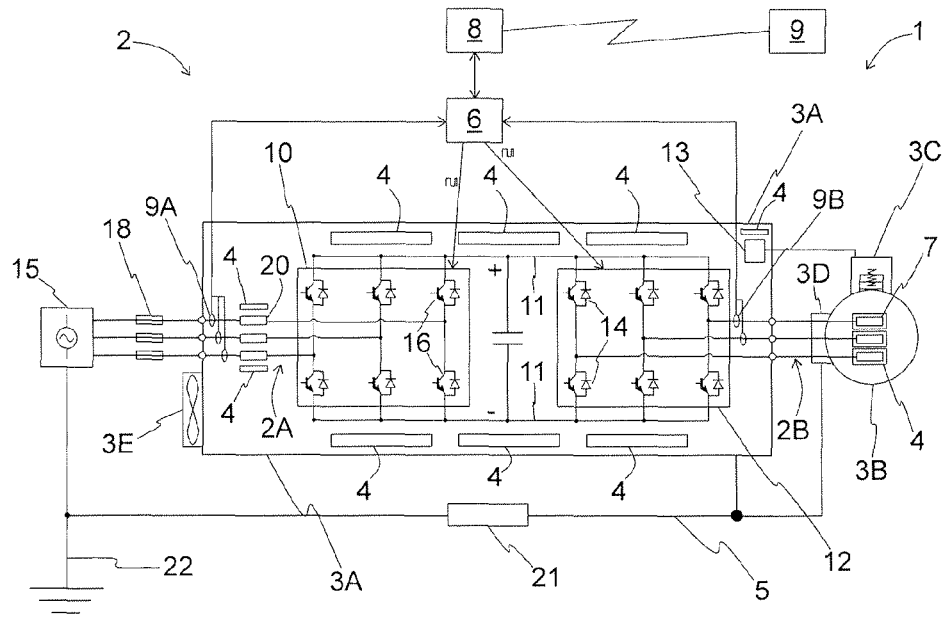

Legend:
1 - motor drive
2 - main circuit of the frequency converter
2A - internal circuit
2B - output circuit
3A, 3B, 3C, 3D, 3E - accessible conducting parts
    3A - sheet-metal enclosure
    3B - conducting frame
    3C - electromagnetic brakes
    3D - terminal box
    3E - fan enclsoure
4 - electrical insulator
5 - earthing means
6 - control unit of the frequency converter
7 - electric motor with frequency converter
8 - elevator control unit
9 - servicing center
9A, 9B - current sensors of the frequency converter
10 - network bridge of the frequency converter
11 - direct-current intermediate circuit
12 - motor bridge
13 - brake control circuit
14 - controllable electronic switches
15 - supply panel
16 - electronic switches
18 - short circuit protective device
20 - chokes
21 - high impedance
22 - earthing electrode

ELEVATOR SAFETY ARRANGEMENT HAVING EARTH FAULT DETECTION

CROSS REFERENCE TO RELATED APPLICATIONS

This application is a Continuation of PCT International Application No. PCT/FI2013/051037, filed on Nov. 1, 2013, which claims priority under 35 U.S.C. 119(a) to Patent Application No. 20126150, filed in the Finland on Nov. 5, 2012, all of which are hereby expressly incorporated by reference into the present application.

FIELD OF THE INVENTION

The invention relates to solutions for monitoring the electrical safety of motor drives and particularly the electrical safety of the motor drives of an elevator or conveyor.

BACKGROUND OF THE INVENTION

The requirements for protection of a motor drive against electric shock are presented e.g. in the standards IEC 61140: "Protection against electric shock. Common aspects for installation and equipment."; IEC 60364-4-41: "Low-voltage electrical installations—Part 4-41: Protection for safety—Protection against electric shock"; IEC 60204-1: "Electrical equipment of machine"; IEC 61800-5-1: "Adjustable Speed electrical power drive systems—Part 5-1: Safety requirements—Electrical, thermal and energy".

According to standard EN 61140 a fundamental rule of protection against electric shock is that hazardous-live parts shall not be accessible and that accessible conductive parts shall not be hazardous live in normal circumstances or as a consequence of a single fault. For these reasons accessible conducting parts are normally earthed.

AIM OF THE INVENTION

One aim of the invention is to improve the protection of elevators against electric shock. To achieve this aim the invention discloses a safety arrangement of an elevator, an elevator system and a method for monitoring electrical safety in an elevator system.

One aim of the invention is to improve the protection of conveyors against electric shock. To achieve this aim the invention discloses a safety arrangement of a conveyor according to claim 14.

One aim of the invention is to improve the protection of a frequency converter, and also of an electric motor to be connected to a frequency converter, against electric shock. To achieve this aim the invention discloses a frequency converter according to claim 20.

The preferred embodiments of the invention are described in the dependent claims. Some inventive embodiments and also inventive combinations of the various embodiments are also presented in the descriptive section and in the drawings of the present application.

SUMMARY OF THE INVENTION

The safety arrangement of an elevator comprises a motor drive of the elevator, which motor drive comprises a main circuit, an accessible conducting part, which is earthed, and also an insulator, which is adapted to electrically insulate the aforementioned conducting part from the aforementioned main circuit. The safety arrangement of an elevator comprises a monitoring circuit, which is configured to determine an earth fault of the aforementioned main circuit and, if the aforementioned earth fault is diagnosed, to form a signal indicating the danger of electric shock in the motor drive of the elevator. In the most preferred embodiment of the invention the aforementioned insulator (electrical insulator) is fitted between the aforementioned conducting part and the aforementioned main circuit. In the invention an earth fault of the main circuit preferably means a situation in which an earthed conducting part comes into electrical contact with a live part of the main circuit as a consequence of an insulation failure. An accessible conducting part means a part that can be accessed without disassembling a structure of the motor drive and which for this reason can cause an electric shock hazard to people in the proximity of the motor drive. The conducting part can be e.g. a part made wholly or partly from metal, which conducts electricity owing to, inter alia, the free charge carriers in it.

The inventors have realized that an insulation fault in the motor drive of an elevator can cause a dangerously high contact voltage in accessible conducting parts of the motor drive of an elevator, even if the aforementioned parts were earthed. This results from, inter alia, the total impedance from a conducting part to earth being so great, owing to the earthing structures used or owing to deficiencies in the earthing structures, that a large contact voltage in an earthed conducting part is possible. In addition, if an earth fault occurs on the output side of a motor drive the short-circuit protections being used on the input side of the motor drive do not necessarily detect a dangerous situation, because voltage conversion and current conversion occur in the motor drive. Consequently the current of the output side can be considerably greater than the current of the input side; also the large impedance of an earthing structure can limit the ground leakage current to below the detection limit. The problem is also cumulative in such a way that when the impedance of an earthing structure, and consequently the contact voltage of an earthed conducting part, increases in an earth fault situation, the ground leakage current decreases, making detection of a dangerous situation more difficult.

The solution according to the invention enables the protection of accessible, earthed conducting parts of a motor drive of an elevator against electric shock, more particularly as a precaution against an insulation failure occurring in the motor drive.

An insulator (electrical insulator) is fitted to electrically insulate a conducting part of the motor drive of an elevator from the main circuit of the motor drive of the elevator when the use of an insulator is necessary for achieving sufficient insulation protecting from electric shock, as specified in the electrical safety regulations or elsewhere, between the aforementioned conducting part of the motor drive of the elevator and the aforementioned live main circuit of the motor drive of the elevator. The aforementioned conducting part of the motor drive of an elevator is preferably earthed with earthing means, preferably with an earthing cable, an earthing bar or corresponding. In one preferred embodiment of the invention the aforementioned conducting part is disposed in the immediate proximity of the main circuit of the motor drive of the elevator. In one preferred embodiment of the invention the aforementioned conducting part mechanically connects to the aforementioned main circuit via the insulator.

The aforementioned earthed conducting part of the motor drive of an elevator can consequently be e.g. a cubicle for electrical devices, or part thereof, a connector of the main circuit of the motor drive, an enclosure or heatsink of the frequency converter, an enclosure of a control device or a user interface in connection with the motor drive, an enclosure of the fan for the power semiconductors of the main circuit, an enclosure of a fan for the electric motor, an enclosure for a brake control device of the elevator, a mechanical brake for the elevator or a brake part, a frame part of the hoisting machine of the elevator or a terminal box on the motor drive of the elevator. The conducting part can also be some part outside the motor drive, which part is accessible and which connects in an electrically conductive manner to an earthed conducting part of the motor drive of the elevator.

In one preferred embodiment of the invention the monitoring circuit is configured to determine an earth fault of the aforementioned main circuit from the ground leakage current of the aforementioned conducting part. In the invention the ground leakage current of a conducting part of the motor drive of an elevator means the current that flows from the live main circuit of the motor drive via the aforementioned conducting part to earth.

In one preferred embodiment of the invention the monitoring circuit is configured to form a signal indicating failure of the aforementioned insulator on the basis of a diagnosed earth fault of the aforementioned main circuit.

In one preferred embodiment of the invention the safety arrangement is functional for forming a signal indicating the danger of electric shock in the motor drive, both when driving with the elevator and during a standstill of the elevator. Consequently the signal indicating the danger of electric shock can be formed as quickly as possible when a dangerous situation occurs, in which case the elevator can be removed from use without it causing a hazard to elevator passengers or to elevator servicing personnel. Servicing personnel can also be informed about the danger of electric shock and corrective actions can in this case be started as quickly as possible after the appearance of the dangerous situation.

In one preferred embodiment of the invention the monitoring circuit comprises a sensor, which is configured to measure the current flowing in the main circuit of the motor drive of the elevator, and the monitoring circuit is configured to determine the ground leakage current of a conducting part of the aforementioned motor drive of the elevator by means of the current measurement data to be received from the sensor. In a preferred embodiment of the invention a sensor belonging to the control apparatus of the hoisting machine of the elevator is used as a sensor, in which case the number of sensors needed in the motor drive becomes less.

In one preferred embodiment of the invention the monitoring circuit comprises a processor and also a memory, in which a program to be executed by the processor is recorded, and a determination method for determining an earth fault of the aforementioned main circuit is recorded in the aforementioned memory.

In one preferred embodiment of the invention the safety arrangement comprises a control circuit in connection with the monitoring circuit for resolving the operating state of the elevator.

In one preferred embodiment of the invention at least two different determination methods for determining an earth fault of the main circuit are recorded in the memory, and the monitoring circuit is configured to select the earth fault determination method to be used at any given time on the basis of the resolved operating state of the elevator.

In one preferred embodiment of the invention the monitoring circuit is configured to use a different determination method when driving with the elevator than during a standstill of the elevator for determining an earth fault.

In one preferred embodiment of the invention the monitoring circuit comprises a memory, in which the threshold value of the ground leakage current of the conducting part is recorded, and the monitoring circuit is configured to diagnose an earth fault in the main circuit when the ground leakage current of the conducting part exceeds the threshold value. In this case the threshold value of the ground leakage current can be selected to be suitable for detecting an electric shock hazard in the conducting part.

In one preferred embodiment of the invention the aforementioned threshold value of a ground leakage current is determined in an earth fault situation from the magnitude of the current flowing via the earthing means of the conducting part of the motor drive of the elevator. In this case the threshold value of the ground leakage current can be selected to be sufficiently small, taking the impedance of the earthing means against earth into account, to prevent dangerous (>50 volts) contact voltage in an earthed conducting part. In this way the problem relating to the simultaneous dangerous contact voltage and low ground leakage current, which hampers detection of an earth fault, resulting from the impedance of an earthing structure in an earth fault situation can be solved.

In one preferred embodiment of the invention the monitoring circuit is configured to select the threshold value of the ground leakage current of the conducting part on the basis of the resolved operating state of the elevator. In this case the threshold value of the ground leakage current can be smaller during a standstill of the elevator than when driving with the elevator, because during a standstill of the elevator also the interference level of the main circuit of the motor drive is smaller, which improves the measurement accuracy/determination accuracy of the ground leakage current.

In one preferred embodiment of the invention the main circuit of the motor drive of the elevator is formed from at least two subcircuits, and the motor drive of the elevator comprises one or more insulators, which is/are adapted to electrically insulate one or more of the aforementioned subcircuits from the earthed conducting part of the motor drive of the elevator. In this case the monitoring circuit can be configured to specify the subcircuit in which an earth fault has occurred. The signal formed by the monitoring circuit indicating a danger of electric shock in the motor drive can also contain more precise information, based on the aforementioned specification, as to which part of the motor drive of the elevator the danger of electric shock applies.

In one preferred embodiment of the invention one or more of the aforementioned subcircuits to be electrically insulated with an insulator from a conducting part of the motor drive is/are connected to at least one second subcircuit with one or more controllable electronic switches, the control pole of which switch(es) is connected to a monitoring circuit. The monitoring circuit is configured by connecting the aforementioned electronic switch/electronic switches to determine an earth fault of a subcircuit to be electrically insulated from the aforementioned conducting part occurring via an earthed conducting part of the motor drive. In this case an earth fault of a conducting part can be determined in a part of the circuit situated in the immediate proximity of the conducting part, in which case the accuracy and reliability of the determination of ground leakage current improve. An IGBT transistor, MOSFET transistor, thyristor, bipolar transistor, silicon-carbide (SiC) MOSFET transistor or corresponding controllable solid-state switch can be used as an electronic switch.

In one preferred embodiment of the invention disconnection means are fitted in connection with the monitoring circuit for disconnecting the current in the main circuit of the motor drive of the elevator, and the monitoring circuit is configured to disconnect the current in the main circuit when an earth fault is diagnosed. In this case the electrical safety of the motor drive can be ensured by de-energizing the conducting part that possesses an electric shock hazard by disconnecting the current of the conducting part immediately after an earth fault has been detected.

In one preferred embodiment of the invention the monitoring circuit is configured to disconnect the current in a subcircuit of the main circuit by opening the electronic switch connecting the subcircuit, that is to be electrically insulated from the conducting part of the motor drive, to the second subcircuit. In this case the conducting part that possesses an electric shock hazard can be de-energized by disconnecting the current from only a part of the main circuit of the motor drive, in which case the electricity supply to the electrical devices of the elevator (lighting, air-conditioning, displays, elevator control unit, et cetera) via a live part of the main circuit is still possible.

In one preferred embodiment of the invention the main circuit comprises two subcircuits, and the motor drive of the elevator comprises one or more insulators, which is/are adapted to electrically insulate the first of these subcircuits from the first earthed conducting part in the motor drive of the elevator and the second of these subcircuits from the second earthed conducting part in the motor drive of the elevator. The monitoring circuit comprises at least two sensors, the first of which is configured to measure the current flowing in the aforementioned first subcircuit and the second is configured to measure the current flowing in the aforementioned second subcircuit. The monitoring circuit is configured to determine the ground leakage current of the aforementioned first conducting part by means of the current measurement data to be received from the first sensor, and the monitoring circuit is configured to determine the ground leakage current of the aforementioned second conducting part by means of the current measurement data to be received from the second sensor. In this case the monitoring arrangement can be configured to specify the conducting part of the motor drive of the elevator, said conducting part being electrically insulated from the subcircuit/subcircuits and in which part ground leakage current flows, and the signal formed by the monitoring circuit indicating a danger of electric shock in the motor drive can also in this case contain more precise information, based on the aforementioned specification, as to which part of the motor drive of the elevator the danger of electric shock applies. In addition, the accuracy of current measurement and consequently the determination accuracy of a ground leakage current of a conducting structure of the elevator improve when the sensor is situated closer to the conducting structure having the ground leakage current being determined.

In one preferred embodiment of the invention the motor drive of the elevator comprises an electric motor and also a frequency converter, with which the electric motor is controlled. The frequency converter comprises a network bridge to be connected to a power source, a motor bridge to be connected to an electric motor, and also a direct-current intermediate circuit connecting the network bridge and the motor bridge.

In one preferred embodiment of the invention the motor bridge comprises controllable electronic switches for supplying electric power from the direct-current intermediate circuit to the electric motor, when driving with the electric motor, and also from the electric motor to the direct-current intermediate circuit, when braking with the electric motor. The motor drive also comprises an insulator, which is adapted to electrically insulate an earthed conducting part of the motor drive of the elevator from the output circuit of the frequency converter, which output circuit is formed from a subcircuit, of the main circuit of the motor drive, continuing from the motor bridge to the electric motor. The monitoring circuit is configured to determine an earth fault of the output circuit of the frequency converter by connecting the electronic switches of the motor bridge with a switching instruction according to the determination method. Consequently an earth fault occurring from the output circuit via a conducting part can be determined accurately and near the conducting part using the controllable electronic switches that are in the motor bridge of the frequency converter.

In one preferred embodiment of the invention the aforementioned sensor is configured to measure the current flowing in the aforementioned output circuit of the frequency converter, and the monitoring circuit is configured to determine the ground leakage current of an earthed conducting part to be electrically insulated with an insulator from the output circuit of the frequency converter from those values for current which the current measured from the output circuit of the frequency converter receives when connecting the electronic switches of the motor bridge with a switching instruction according to the current determination method.

In one preferred embodiment of the invention the monitoring circuit is configured, when diagnosing an earth fault in the output circuit, to disconnect with the aforementioned controllable electronic switches of the motor bridge the electricity supply in the output circuit of the frequency converter. In this case the conducting part can be de-energized by disconnecting the current only in the output circuit of the frequency converter, in which case the electricity supply to the electrical devices of the elevator (lighting, air-conditioning, displays, elevator control unit, et cetera) is still possible via a live part of the main circuit, such as via a direct-current intermediate circuit. In addition, the ground leakage current can be disconnected and the conducting part that possesses an electric shock hazard can be de-energized using the controllable electronic switches that are in the motor bridge.

In one preferred embodiment of the invention the motor drive of the elevator comprises an insulator, which is adapted to electrically insulate an earthed conducting part of the motor drive from the internal circuit of the frequency converter, which internal circuit is formed from a subcircuit of the main circuit of the motor drive, continuing from the motor bridge via the direct-current intermediate circuit and network bridge to the supply conductors of the power source. The monitoring circuit is configured to determine an earth fault of the internal circuit of the frequency converter, and the monitoring circuit is configured when it diagnoses an earth fault in the internal circuit to disconnect the electricity supply from the power source to the internal circuit of the frequency converter. Consequently an earth fault occurring from the internal circuit via a conducting part can be determined accurately and near the conducting part. In addition, the conducting part causing an electric shock hazard can be de-energized by disconnecting the current in the internal circuit of the frequency converter. In addition, when the current in the internal circuit of the frequency converter is disconnected, the current flow in the main circuit of the frequency converter disconnects and the danger of electric shock is removed.

In one preferred embodiment of the invention the aforementioned sensor is configured to measure the current flowing in the aforementioned internal circuit of the frequency converter, and the monitoring circuit is configured to determine the ground leakage current of the conducting part to be electrically insulated with an insulator from the internal circuit of the aforementioned frequency converter from the current flowing in the internal circuit. The monitoring circuit is configured to disconnect the electricity supply from the power source to the internal circuit when the ground leakage current of the aforementioned conducting part to be electrically insulated from the internal circuit exceeds a threshold value.

In one preferred embodiment of the invention the safety arrangement comprises a contactor, which is fitted in series between the power source and the internal circuit of the frequency converter, the monitoring circuit is configured to disconnect the electricity supply from the power source to the internal circuit by controlling the contacts of the contactor open. In this case the conducting part that possesses an electric shock hazard can be de-energized with the contactor.

In one preferred embodiment of the invention the network bridge comprises controllable electronic switches for supplying electric power between the power source and the direct-current intermediate circuit, and the safety arrangement comprises a short-circuit protective device, which is fitted in series between the power source and the network bridge. The monitoring circuit is configured to disconnect the electricity supply from the power source to the internal circuit by tripping the short-circuit protective device by controlling the electronic switches in the different phases of the network bridge to be simultaneously conductive. In this case the conducting part causing an electric shock hazard can be de-energized by tripping the short-circuit protective device, in which case the current from the power source to the internal circuit of the frequency converter is disconnected. The solution is consequently suited for use also in systems in which the frequency controller is implemented without a single mechanical contactor.

In one preferred embodiment of the invention the monitoring circuit comprises a power meter for measuring the power entering the main circuit of the motor drive and also the power leaving the main circuit, and the monitoring circuit is configured to determine an earth fault of the main circuit of the motor drive of the elevator occurring via an earthed conducting part of the motor drive of the elevator from the difference between the power coming into the main circuit and the power leaving the main circuit. In the most preferred embodiment of the invention the monitoring circuit is configured to form a signal indicating the danger of electric shock in the motor drive, if the power $P_{out}$ leaving the main circuit is greater by the amount of the predetermined threshold value s than the power $P_{in}$ coming into the main circuit times the internal efficiency ratio η of the main circuit:

$$P_{out} - P_{in} * \eta \geq s.$$

By using a measurement of power in the determination of ground leakage current instead of just a measurement of current, the accuracy of the determination of ground leakage current can be improved because, unlike in the measuring of current, in the measuring of power the correct measurement result is obtained regardless of the current/voltage conversion occurring in the main circuit.

The invention also relates to a safety arrangement of a conveyor, which safety arrangement comprises a motor drive of the conveyor, which motor drive comprises a main circuit, an accessible conducting part, which is earthed, and also an insulator, which is adapted to electrically insulate the aforementioned conducting part from the aforementioned main circuit. The safety arrangement of a conveyor comprises a monitoring circuit, which is configured to determine an earth fault of the aforementioned main circuit and, if the aforementioned earth fault is diagnosed, to form a signal indicating the danger of electric shock in the motor drive of the conveyor. The aforementioned conveyor is preferably a travelator or an escalator.

The solution according to the invention enables the protection of accessible, earthed, conducting parts of the motor drive of a conveyor against electric shock, more particularly as a precaution against an insulation failure occurring in the motor drive.

The invention also relates to an elevator system, which comprises a motor drive for driving an elevator car. The elevator system also comprises a safety arrangement according to the description, for monitoring the electrical safety of the elevator.

In one preferred embodiment of the invention the safety arrangement comprises a drive prevention apparatus connected to the monitoring circuit, which apparatus is configured to remove the elevator from use when an earth fault is diagnosed. In this case use of the elevator can be prevented when the electrical safety of the motor drive is impaired.

In one preferred embodiment of the invention the elevator system is equipped to send a signal indicating the danger of electric shock in the motor drive to a servicing center via a remote connection. In this case impairment of electrical safety and an electric shock hazard can be brought to the attention of the service personnel of the elevators as soon as possible after detecting the hazard, and also corrective actions and measures ensuring safety can be started as soon as possible.

The frequency converter according to the invention for driving an electric motor comprises an earthed conducting part and also a main circuit, which comprises a network bridge, a direct-current intermediate circuit, a motor bridge, a connection for the electric motor of the hoisting machine and also a connection for a power source. The frequency converter also comprises an insulator, which is adapted to electrically insulate the aforementioned conducting part to be earthed from the aforementioned main circuit. The frequency converter further comprises a monitoring circuit, which is configured to determine an earth fault of the main circuit occurring via the aforementioned conducting part to be earthed and, when the aforementioned earth fault is diagnosed, to form a signal indicating the danger of electric shock. The frequency converter according to the invention enables the protection from electric shock of accessible, earthed, conducting parts in the frequency converter as well as in the immediate proximity of the main circuit of the frequency converter, e.g. as a precaution against an insulation failure.

In one preferred embodiment of the invention the monitoring circuit is configured to determine the ground leakage current of the conducting part to be earthed. The monitoring circuit comprises a memory for recording a threshold value for ground leakage current, and the monitoring circuit is configured to diagnose an earth fault when the determined ground leakage current of the aforementioned conducting part to be earthed exceeds the aforementioned threshold value for ground leakage current.

In one preferred embodiment of the invention the monitoring circuit comprises a processor and also a memory, in which a program to be executed by the processor is recorded. A determination method for determining an earth fault of the main circuit occurring via the aforementioned conducting part to be earthed is recorded in the aforementioned memory.

In the method according to the invention for monitoring electrical safety in an elevator system an accessible conducting part of the motor drive of the elevator is earthed with earthing means, the aforementioned earthed conducting part is electrically insulated from the main circuit of the motor drive of the elevator with an insulator, an earth fault of the main circuit occurring via the aforementioned earthed conducting part is determined, and, if the aforementioned earth fault is diagnosed, a signal indicating the danger of electric shock in the motor drive is formed.

In one preferred embodiment of the invention a ground leakage current of the aforementioned earthed conducting part is determined, and also an earth fault of the main circuit occurring via the aforementioned earthed conducting part is diagnosed, when the determined earth fault current exceeds the threshold value for the current.

In one preferred embodiment of the invention the operating state of the elevator is determined and also an earth fault of the main circuit occurring via the aforementioned conducting part is determined using a first determination method when driving with the elevator, and an earth fault of the main circuit occurring via the aforementioned conducting part is determined using a second determination method during a standstill of the elevator, said second method differing from the first method.

In one preferred embodiment of the invention the electronic switches of the motor bridge of the frequency converter of the motor drive of an elevator are connected with a switching instruction according to the current determination method, the current of the frequency converter is determined and also the ground leakage current of the aforementioned conducting part is determined from those values for current which the current of the frequency converter receives when connecting the electronic switches of the motor bridge with a switching instruction according to the current determination method.

In one preferred embodiment of the invention the current in the main circuit of the motor drive of the elevator is disconnected when an earth fault is diagnosed in the main circuit.

In one preferred embodiment of the invention the electronic switches are connected in the different phases of the network bridge of the frequency converter of the motor drive of the elevator to be simultaneously conducting when an earth fault of the main circuit is diagnosed.

As an addition to the invention presented above, or alternatively as a wholly separate invention, an apparatus and a method are also disclosed for disconnecting the power supply of the motor drive of an elevator. The apparatus comprises a frequency converter, which comprises a network bridge and also a direct-current intermediate circuit. The network bridge comprises controllable electronic switches for supplying electric power between the power source of the motor drive and the direct-current intermediate circuit, and the apparatus comprises a short-circuit protective device, which is fitted in series between the power source and the network bridge. The apparatus also comprises a control circuit, which is configured to receive a control signal and also on the basis of the control signal to trip the short-circuit protective device by controlling the electronic switches in the different phases of the network bridge to be simultaneously conductive. In this case the motor drive can be de-energized, e.g. in a dangerous situation of the elevator, by tripping the short-circuit protective device on the basis of a control signal indicating the dangerous situation. In the method a short-circuit protective device is fitted between the power source and the network bridge of the frequency converter of the motor drive of an elevator, the safety of the elevator is determined and also the electronic switches are connected in the different phases of the network bridge to be simultaneously conducting when it is detected that the safety of the elevator is impaired.

The preceding summary, as well as the additional features and additional advantages of the invention presented below, will be better understood by the aid of the following description of some embodiments, said description not limiting the scope of application of the invention.

BRIEF EXPLANATION OF THE FIGURE

FIG. 1 presents a diagrammatic view of an elevator system according to an embodiment of the invention.

MORE DETAILED DESCRIPTION OF PREFERRED EMBODIMENTS OF THE INVENTION

FIG. 1 presents a diagrammatic view of a motor drive 1 of an elevator. The motor drive 1 comprises a frequency converter and a hoisting machine. The elevator car is driven in an elevator hoistway with a hoisting machine via rope friction or belt friction. The speed of the elevator car is adjusted to be according to the target value for the speed of the elevator car, i.e. the speed reference, calculated by the elevator control unit 8. The speed reference is formed in such a way that the elevator car can transfer elevator passengers from one floor to another on the basis of elevator calls given by passengers. In the embodiment of FIG. 1 the elevator system is without machine room, in which case the hoisting machine and also the frequency converter are disposed in the elevator hoistway. However, the invention is also suited for use in elevator systems provided with machine rooms.

The elevator car is connected to the counterweight with ropes or with a belt traveling via the traction sheave of the hoisting machine. Various elevator mechanics solutions known in the art can be used in an elevator system, which do not however clarify the invention and are consequently not presented in order to simplify the description.

The hoisting machine comprises an electric motor 7, with which the elevator car is driven by rotating the traction sheave, as well as two electromagnet brakes 3C, with which the traction sheave is braked and held in its position. The hoisting machine is driven by supplying electric power with the frequency converter from the supply panel 15 of the building to the electric motor 7. The supply panel 15 is situated outside the elevator hoistway and consequently in a different location than the motor drive 1 of the elevator. The frequency converter comprises a main circuit 2, which comprises a network bridge 10, with which the supply voltage of the alternating electricity network coming from the supply panel 15 is rectified into the direct-current intermediate circuit 11 of the frequency converter. The direct-current voltage of the direct-current intermediate circuit 11 is further converted into the variable-amplitude and variable-frequency supply voltage of the electric motor 7 by switching the IGBT transistors 14 of the motor bridge 12. Adjustment of the speed of the elevator car occurs with the control unit 6 of the frequency converter, which control unit receives a speed reference from the elevator control unit 8 via a data channel between the control unit 6 of the frequency converter and the elevator control unit 8. The control unit 6 of the frequency converter receives measuring data about the speed of rotation of the traction sheave of the hoisting machine of the elevator and adjusts the speed of rotation of the traction sheave, and consequently the speed of the elevator car, to be according to the speed reference by adjusting the torque of the electric motor 7 with the frequency converter. Adjustment of torque occurs by forming the output voltage of the motor bridge with IGBT transistors 14 by modulating, i.e. by connecting the IGBT transistors with a suitable switching instruction preferably according to pulse width modulation.

During motor braking power returns from the electric motor 7 to the direct-current intermediate circuit 11 of the frequency converter, in which case the voltage of the direct-current intermediate circuit 11 starts to rise. The returning power is supplied from the direct-current intermediate circuit 11 onwards to the electricity network by adjusting the current of the mains chokes 20 by switching the IGBT transistors 16 of the network bridge 10. The voltage of the direct-current intermediate circuit 11 can be adjusted by means of a chopper circuit formed by the chokes 20 and the IGBT transistors to a set constant voltage higher than the network voltage. One constant voltage of a direct-current intermediate circuit 11 suitable for a European 230-Volt electricity network is approx. 650 Volts, but the voltage can also be higher or lower than this.

The electromagnetic brakes 3C of the hoisting machine are controlled by supplying current to the electromagnets of the brakes with a brake control circuit 13, which is connected to the direct-current intermediate circuit 11 of the frequency converter.

In the motor drive of an elevator are accessible parts conducting electricity, which for safety reason are earthed. Consequently the frame part 3B of the hoisting machine as well as the machinery brakes 3C attached to the frame part 3B are earthed by fixing an earthing cable 5 (a yellow-green cable as per electrical installation instruction) at the point of the terminal box 3D of the motor. Also the sheet-metal enclosure 3A of the frequency converter as well as the fan enclosure 3E are connected to the aforementioned earthing cable 5. The earthing cable 5 runs in the same cable bundle as the supply cables coming from the supply panel 15, and the second end of it is connected to an earthing electrode 22 in the supply panel 15.

Owing to the high voltage in the main circuit of the frequency converter, the live parts of the main circuit are insulated from the aforementioned accessible, electrically-conductive parts 3A, 3B, 3C, 3D, 3E of the motor drive with an electrical insulator 4, i.e. with a material that conducts electricity badly and is did-electric, i.e. resistant to an external electrical field. A suitable plastic, ceramic, varnish, et cetera, can be used as the insulator 4. The insulation is made in those points in which the live main circuit 2 is situated so close to the conducting part 3A, 3B, 3C, 3D, 3E that use of an insulator 4 is necessary in order to achieve a sufficient insulation distance. In the embodiment of FIG. 1 insulators 4 have been used to insulate the chokes 20 in the frequency converter, the network bridge 10, the direct-current intermediate circuit 11, the motor bridge 12 and also the brake controller 13 from the sheet-metal enclosure 3A of the frequency converter. In addition, an insulator 4 has been used to insulate the windings of the motor 7 from the conducting frame 3B of the hoisting machine.

Damage of an insulator 4 can cause an earth fault, i.e. an electrical connection of a live part of the main circuit 2 to a conducting part 3A, 3B, 3C, 3D, 3E and onwards via the earthing cable 5 of the conducting part 3A, 3B, 3C, 3D, 3E to earth 22. In the embodiment of FIG. 1 the earthing cable 5 is quite long because the earthing cable is connected to the earthing electrode only in the supply panel 15, which is disposed at a distance from the motor drive 1. Consequently the impedance 21 of the earthing cable 5 is so great that an earth fault causes a dangerously high (over 50 Volts) contact voltage in the aforementioned accessible earthed parts 3A, 3B, 3C, 3D, 3E. The high impedance 21 of the earthing cable also limits the ground leakage current flowing in the earthing cable 5, which hampers detection of an earth fault, and e.g. conventional residual current protection in the supply panel 15 is not necessarily able to detect an earth fault. Detection is also hampered by the voltage conversion and current conversion occurring in the motor drive, i.e. the current leaving the motor bridge 12 into the motor cables can be considerably larger than the current flowing from the supply panel 15 to the network bridge 10. The aforementioned voltage conversion and current conversion can be caused by, inter alia, energy storages in the main circuit of the frequency converter, said storages being such as capacitors in the intermediate circuit 11, chokes and also the inductance in the windings of the motor, which energy storages can in certain situations supply some of the ground leakage current.

For the aforementioned reasons, among others, a safety arrangement is arranged in the motor drive 1 of the elevator, with which safety arrangement the electrical safety of the motor drive 1 of the elevator can be monitored as a precaution against the earth fault situations described above. The safety arrangement is implemented with the existing components of the frequency converter in such a way that a monitoring program is recorded in the software of the control unit 6 of the frequency converter, which program receives current measuring data from the current sensors 9A, 9B of the frequency converter and also receives from the elevator control unit 8 information about the operating state of the elevator and controls the IGBT transistors 14, 16 of the network bridge 10 and of the motor bridge 12 of the frequency converter, on the one hand, for collecting information about an earth fault and, on the other hand, for bringing the motor drive 1 into a safe state when an earth fault is diagnosed. When an earth fault is diagnosed the control unit 6 of the frequency converter sends information about the danger of electric shock relating to the earthed, accessible parts 3A, 3B, 3C, 3D, 3E of the motor drive to the control unit 8 of the elevator, which sends the information onwards to the servicing center 9 for the elevators, e.g. via a wireless connection, an Internet connection or some other such suitable remote connection. In the following the operation of the aforementioned safety arrangement will be described in more detail.

The control unit 6 of the frequency converter receives from the elevator control unit 8 information about the operating state of the elevator, i.e. inter alia whether the elevator is driving or whether the elevator car is standing empty waiting for passengers. The software of the control unit 6 of the frequency converter comprises different determination methods for determining an earth fault when driving with the elevator than during a standstill of the elevator.

An earth fault occurring in the output circuit 2B of the frequency converter, i.e. in a subcircuit of the main circuit 2 continuing from the motor bridge 12 to the electric motor 7, is determined during a standstill of the elevator by connecting the IGBT transistors of the motor bridge 12 that connect to the positive+busbar of the direct-current intermediate circuit 11, or alternatively by connecting the IGBT transistors of the motor bridge 12 that connect to the negative-busbar of the direct-current intermediate circuit 11, one at a time to be conductive and by measuring with the current sensors 9B the current flowing in the output circuit 2B. Current starts to flow if the output circuit 2B connects to an earth fault, e.g. as a consequence of damage of the winding insulations of the motor or as a consequence of an insulation failure of the supply cables of the motor. Current does not flow at all or the current is extremely small if there is no earth fault in the output circuit 2B. A threshold value K1 is recorded in the memory of the control unit 6 of the frequency converter, to which threshold value the measured current is compared, and the control unit 6 diagnoses that an earth fault has occurred if the current measured from the output circuit 2B of the frequency converter exceeds the threshold value K1.

An earth fault in the output circuit 2B of the frequency converter can also be determined during a run with the elevator. In this case the IGBT transistors of the motor bridge 12 that connect to the positive busbar of the direct-current intermediate circuit 11, or alternatively the IGBT transistors that connect to the negative busbar of the direct-current intermediate circuit 11, are connected to be simultaneously conductive, in which case the supply leads of the motor receive zero voltage. The current flowing in the output circuit 2B is measured with the current sensors 9B, and if a change in the current exceeds the threshold value K2 recorded in the control unit 6 of the frequency converter, the control unit 6 diagnoses that an earth fault has occurred. The determination method for an earth fault presented is suited to the motor drive according to FIG. 1, in which the output circuit 2B comprises current sensors 9B in only two of the three different phases of the motor 7. If there were separate current sensors in all three phases, an earth fault could also be determined from the resultant of the measured currents, i.e. from the length of the sum vector of the current vectors: an earth fault is diagnosed in the output circuit if the aforementioned resultant of the currents exceeds a certain threshold value.

The threshold value K1 is smaller than the threshold value K2 for the reason, among others, that the interference level of the main circuit 2 during a standstill of the elevator is smaller than when driving with the elevator, so that an earth fault can also be determined with a smaller threshold value k1 for current during a standstill of the elevator than when driving with the elevator (threshold value K2). A small threshold value K1 for current facilitates the diagnosing of an electric shock hazard particularly in those motor drives 1 in which the earth fault current is small owing to, inter alia, the high impedance 21 of the earth fault conductor 5.

Instead of measurement of the current, an earth fault of the output circuit 2B could in some cases also be determined by measuring the voltage of the direct-current intermediate circuit 11, more particularly if a large impedance, such as a charging resistor for the intermediate circuit capacitors, is in series on the supply side of the frequency converter. In this case an earth fault in the output circuit 2B causes the intermediate circuit voltage to drop.

When the control unit 6 of the frequency converter diagnoses that an earth fault has occurred, the control unit 6 sends information about the electric shock hazard to the elevator control unit 8, from where it is sent onwards to the servicing center 9 for the elevators, as stated above. The elevator control unit 8 also removes the elevator from use, recording the drive prevention regulation in non-volatile memory, and after this use of the elevator is prevented on the basis of the drive prevention regulation recorded in memory. In the same context the control unit 6 of the frequency converter disconnects the current flow in the output circuit 2B by opening the IGBT transistors of the motor bridge, in which case the output circuit 2B and the earthed conducting part 3B, 3C in earth fault are de-energized.

An earth fault occurring in the internal circuit 2A of the frequency converter, i.e. in a subcircuit of the main circuit 2 continuing from the motor bridge 12 via the direct-current intermediate circuit 11 and the network bridge 10 to the current sensors 9A of the input side, is determined by measuring the currents flowing in the supply conductors of the network bridge 10 with the current sensors 9A and also by calculating the resultant of the measured currents, i.e. the length of the sum vector of the current vectors, in the control unit 6 of the frequency converter. A threshold value K3 is recorded in the memory of the control unit 6 of the frequency converter, to which threshold value the calculated resultant of the currents is compared, and the control unit 6 diagnoses that an earth fault has occurred if the calculated resultant of the currents (which is proportional to the magnitude of the ground leakage current) exceeds the aforementioned threshold value. The threshold value K3 of the resultant of the currents is selected to be so small that an earth fault is detected even though the impedance 21 of the earthing conductor 5 were to limit the ground leakage current.

If the motor drive 1 of the elevator can be isolated with a contactor from the supply panel 15, the motor drive can be completely de-energized by opening the contacts of the contactor after an earth fault is diagnosed. In the embodiment of FIG. 1 the motor drive 1 of the elevator is, however, implemented without contactors, in which case, when an earth fault is diagnosed, the motor drive is completely de-energized by connecting the IGBT transistors of the network bridge 10 to be simultaneously conductive, in which case the supply conductors connect into short-circuit, the fuses 18 in the supply board 15 burn out and the current supply to the motor drive 1 disconnects. Instead of a fuse, also e.g. a line protection breaker or an automatic fuse could be used as a short-circuit protective device 18.

The control unit 6 also sends information about the electric shock hazard to the elevator control unit 8, from where it is sent onwards to the servicing center 9 for the elevators, as stated above. The elevator control unit 8 also removes the elevator from use, recording the drive prevention regulation in non-volatile memory, and after this use of the elevator is prevented on the basis of the drive prevention regulation recorded in memory.

Taking the elevator into use again requires that a serviceman resets from a manual user interface of the elevator control unit 8 the drive prevention regulation to off on his/her visit to the elevator.

In some embodiments the electric shock warning sent by the control unit 6 of the frequency converter also contains information as to whether an earth fault has occurred in the internal circuit 2A of the frequency converter or in the output circuit 2B of the frequency converter. The information can be transmitted to a servicing center 8, and it can be used to facilitate fault repair.

The invention is described above by the aid of a few examples of its embodiment. It is obvious to the person skilled in the art that the invention is not only limited to the embodiments described above, but that many other applications are possible within the scope of the inventive concept defined by the claims.

The invention claimed is:

1. A safety arrangement of an elevator, comprising:
a motor drive of the elevator;
a frequency converter configured to adjust the speed of an elevator car comprising:
a main circuit; and
at least one accessible conducting part, which is earthed via a supply cable coming from a supply panel of an electricity network, the at least one accessible conducting part includes at least one of:
an enclosure of the frequency converter;
a conducting frame of a hoisting machine of the elevator;
at least one electromagnetic brake configured to stop rotation of a traction sheave of the elevator;
a terminal box of the motor drive; and
a fan enclosure of the frequency converter,
wherein the motor drive of the elevator comprises an insulator, which electrically insulates the at least one accessible conducting part from the main circuit, and
wherein the safety arrangement of the elevator comprises a monitoring circuit comprising at least one sensor configured to monitor current flowing in the main circuit, the monitoring circuit is configured to determine an earth fault of the main circuit and the at least one accessible conducting part and, if the earth fault is diagnosed, to form a signal indicating the danger of electric shock in the motor drive of the elevator, to form a signal indicating the location of the earth fault and to disconnect the current of the main circuit or one of the at least one accessible conducting part that has the earth fault.

2. The safety arrangement according to claim 1, wherein the monitoring circuit is configured to determine the ground leakage current of the at least one accessible conducting part, and
wherein the monitoring circuit is configured to determine an earth fault of the main circuit on the basis of the ground leakage current of the at least one accessible conducting part.

3. The safety arrangement according to claim 1, wherein the safety arrangement is configured to generate a signal indicating the danger of electric shock in the motor drive both when driving with the elevator and during a standstill of the elevator.

4. The safety arrangement according to claim 3, wherein the monitoring circuit is configured to use a different determination method when driving with the elevator than during a standstill of the elevator for determining an earth fault.

5. The safety arrangement according to claim 2, wherein:
the monitoring circuit comprises a memory, in which the threshold value of the ground leakage current of the aforementioned at least one accessible conducting part is recorded;
the threshold value is determined in an earth fault situation from the magnitude of the current flowing via the earthing mechanism of the at least one accessible conducting part; and
the monitoring circuit is configured to diagnose an earth fault in the main circuit when the ground leakage current of the at least one accessible conducting part exceeds the threshold value.

6. The safety arrangement according to claim 1, wherein:
the main circuit of the motor drive of the elevator is formed from at least two subcircuits; and
the motor drive of the elevator comprises one or more insulators, which is/are adapted to electrically isolate one or more of the subcircuits from the accessible, earthed at least one accessible conducting part of the motor drive of the elevator.

7. The safety arrangement according to claim 6, wherein:
one or more of the subcircuits to be electrically insulated from a conducting part of said at least one accessible conducting part of the motor drive is/are connected to at least one second subcircuit with one or more controllable electronic switches, the control pole of which switch(es) is connected to the monitoring circuit; and
the monitoring circuit is configured by connecting the electronic switch/electronic switches to determine an earth fault of the subcircuit to be electrically insulated from the conducting part occurring via the earthed conducting part.

8. The safety arrangement according to claim 1, wherein:
the motor drive of the elevator comprises an electric motor and the frequency converter, with which the electric motor is controlled; and
the frequency converter comprises a network bridge to be connected to a power source, a motor bridge to be connected to an electric motor, and a direct-current intermediate circuit connecting the network bridge and the motor bridge.

9. The safety arrangement according to claim 8, wherein:
the motor bridge comprises controllable electronic switches for supplying electric power from the direct-current intermediate circuit to the electric motor, when driving with the electric motor and also from the electric motor to the direct-current intermediate circuit when braking with the electric motor;
the motor drive comprises an insulator, which is adapted to electrically insulate at least one accessible conducting part of the motor drive of the elevator from the output circuit of the frequency converter, which is formed from a subcircuit of the main circuit of the motor drive continuing from the motor bridge to the electric motor; and
the monitoring circuit is configured to determine an earth fault of the output circuit of the frequency converter by connecting the electronic switches of the motor bridge with a switching instruction according to the determination method for an earth fault.

10. The safety arrangement according to claim 1, wherein:
a disconnection is fitted in connection with the monitoring circuit for disconnecting the current in the main circuit of the motor drive of the elevator; and
the monitoring circuit is configured to disconnect the current in the main circuit when an earth fault is diagnosed.

11. The safety arrangement according to claim 10, wherein:
the motor drive of the elevator comprises an insulator, which is adapted to electrically insulate at least one accessible conducting part of the motor drive from the internal circuit of the frequency converter, which internal circuit is formed from a subcircuit of the main circuit of the motor drive continuing from the motor bridge via the direct-current intermediate circuit and network bridge to the supply conductors of the power source;

the monitoring circuit is configured to determine an earth fault of the internal circuit of the frequency converter; and the monitoring circuit is configured when it diagnoses an earth fault in the internal circuit to disconnect the electricity supply from the power source to the internal circuit of the frequency converter.

12. The safety arrangement according to claim 11, wherein:
the network bridge comprises controllable electronic switches for supplying electric power between the power source and the direct-current intermediate circuit;
the safety arrangement comprises a short-circuit protective device, which is fitted in series between the power source and the network bridge; and
the monitoring circuit is configured to disconnect the electricity supply from the power source to the internal circuit by tripping the short-circuit protective device by controlling the electronic switches in the different phases of the network bridge to be simultaneously conductive.

13. A safety arrangement of a conveyor, comprising a motor drive of the conveyor, which comprises:
a frequency converter comprising:
a main circuit; and
at least one accessible conducting part, which is earthed via a supply cable coming from a supply panel of an electricity network, the at least one accessible conducting part includes at least one of:
an enclosure of the frequency converter;
a conducting frame of a hoisting machine of the elevator;
at least one electromagnetic brake configured to stop rotation of a traction sheave of the elevator;
a terminal box of the motor drive; and
a fan enclosure of the frequency converter,
wherein the motor drive of the conveyor comprises an insulator, which electrically insulates the at least one accessible conducting part from the main circuit, and
wherein the safety arrangement of the conveyor comprises a monitoring circuit comprising at least one sensor configured to monitor current flowing in the main circuit, is the monitoring circuit is configured to determine an earth fault of the main circuit and the at least one accessible conducting part and, if the earth fault is diagnosed, to form a signal indicating the danger of electric shock in the motor drive of the conveyor, to form a signal indicating the location of the earth fault and to disconnect the current of the main circuit or one of the at least one accessible conducting part that has the earth fault.

14. An elevator system, which comprises a motor drive for driving an elevator car, wherein the elevator system comprises the safety arrangement according to claim 1 for monitoring the electrical safety of an elevator.

15. The elevator system according to claim 14, wherein the safety arrangement comprises a drive prevention apparatus connected to the monitoring circuit, which apparatus is configured to remove the elevator from use when an earth fault is diagnosed.

16. The elevator system according to claim 14, wherein the elevator system is equipped to send a signal indicating the danger of electric shock in the motor drive to a servicing center via a remote connection.

17. The elevator system according to claim 14, wherein:
the elevator system is an elevator system without machine room;
the supply panel of the elevator is disposed outside the elevator hoistway; and
the motor drive of the elevator is disposed in the elevator hoistway.

18. The elevator system according to claim 17, wherein the at least one accessible conducting part of the motor drive is earthed with earth electrodes only in the supply panel of the elevator.

19. A frequency converter for driving an electric motor of an elevator, comprising:
at least one accessible conducting part earthed via a supply cable coming from a supply panel of an electricity network, the at least one accessible conducting part includes at least one of:
an enclosure of the frequency converter;
a conducting frame of a hoisting machine of the elevator;
at least one electromagnetic brake configured to stop rotation of a traction sheave of the elevator;
a terminal box of the motor drive; and
a fan enclosure of the frequency converter; and
a main circuit, which comprises:
a network bridge;
a direct-current intermediate circuit;
a motor bridge;
a connection for an electric motor; and
a connection for a power source, wherein the frequency converter comprises an insulator, which electrically insulates the at least one accessible conducting part earthed from the main circuit, and
wherein the frequency converter comprises a monitoring circuit comprising at least one sensor configured to monitor current flowing in the safety arrangement, the monitoring circuit is configured to determine an earth fault of the main circuit and at least one accessible conducting part and, if the earth fault is diagnosed, to form a signal indicating the danger of electric shock, to form a signal indicating the location of the earth fault and to disconnect the current of the main circuit or one of the at least one accessible conducting part that has the earth fault.

20. A method for monitoring electrical safety in an elevator system, comprising the steps of:
earthing at least one accessible conducting part of a frequency converter of the motor drive of the elevator via a supply cable coming from a supply panel of an electricity network, the at least one accessible conducting part includes at least one of:
an enclosure of the frequency converter;
a conducting frame of a hoisting machine of the elevator;
at least one electromagnetic brake configured to stop rotation of a traction sheave of the elevator;
a terminal box of the motor drive; and
a fan enclosure of the frequency converter;
electrically insulating the at least one accessible conducting part from the main circuit of the motor drive of the elevator with an insulator; and
determining an earth fault of the main circuit or of the at least one accessible conducting part, and if the earth fault is diagnosed, forming a signal indicating the danger of electric shock in the motor drive, forming a signal indicating the location of the earth fault and disconnecting the current of the main circuit or one of the at least one accessible conducting part that has the earth fault.

\* \* \* \* \*